US006624684B2

(12) United States Patent
Glidden

(10) Patent No.: US 6,624,684 B2
(45) Date of Patent: Sep. 23, 2003

(54) COMPACT HIGH VOLTAGE SOLID STATE SWITCH

(75) Inventor: Steven C. Glidden, Freeville, NY (US)

(73) Assignee: Applied Pulsed Power, Inc., Ithaca, NY (US)

( * ) Notice: Subject to any disclaimer, the term of this patent is extended or adjusted under 35 U.S.C. 154(b) by 0 days.

(21) Appl. No.: 10/121,643

(22) Filed: Apr. 12, 2002

(65) Prior Publication Data

US 2002/0149414 A1 Oct. 17, 2002

Related U.S. Application Data

(60) Provisional application No. 60/283,594, filed on Apr. 13, 2001.

(51) Int. Cl.[7] .............................................. H03K 17/72
(52) U.S. Cl. ....................................................... 327/438
(58) Field of Search ................................ 327/438, 440, 327/441, 442, 443

(56) References Cited

U.S. PATENT DOCUMENTS

| 3,928,776 A | 12/1975 | Thiele ......................... 307/252 |
| 5,331,234 A | 7/1994 | Merritt et al. ............... 307/631 |
| 5,796,599 A | * 8/1998 | Raonic et al. ................. 363/57 |
| 6,140,866 A | * 10/2000 | Wang .......................... 327/552 |

OTHER PUBLICATIONS

"Snubber Circuit For High Voltage Thyristors"; Research Disclosure, Kenneth Mason Publications; Dec. 1, 1994; 2 sheets.
"High–Power Thyristor Pulse Commutator"; Gubanov et al; Instruments and Experimental Techniques; Jan. 1986; 1 sheet.

* cited by examiner

Primary Examiner—Jeffrey Zweizig
(74) Attorney, Agent, or Firm—Brown & Michaels, P.C.

(57) ABSTRACT

A compact, solid state, high voltage switch capable of high conduction current with a high rate of current risetime (high di/dt) that can be used to replace thyratrons in existing and new applications. The switch has multiple thyristors packaged in a single enclosure. Each thyristor has its own gate drive circuit that circuit obtains its energy from the energy that is being switched in the main circuit. The gate drives are triggered with a low voltage, low current pulse isolated by a small inexpensive transformer. The gate circuits can also be triggered with an optical signal, eliminating the trigger transformer altogether. This approach makes it easier to connect many thyristors in series to obtain the hold off voltages of greater than 80 kV.

9 Claims, 6 Drawing Sheets

COMPACT HIGH VOLTAGE SOLID STATE SWITCH

REFERENCE TO RELATED APPLICATIONS

This application claims an invention which was disclosed in Provisional Application No. 60/283,594, filed Apr. 13, 2001, entitled "High Voltage, High Power, High di/dt, Low Inductance Solid State Switch". The benefit under 35 USC §119(e) of the United States provisional application is hereby claimed, and the aforementioned application is hereby incorporated herein by reference.

ACKNOWLEDGMENT OF GOVERNMENT SUPPORT

This invention was made with Government support under Grant No. DE-FG02-00ER82948, awarded by the Department of Energy. The government has certain rights in the invention.

BACKGROUND OF THE INVENTION

1. Field of the Invention

The invention pertains to the field of high voltage switches. More particularly, the invention pertains to solid state high voltage switches used to discharge energy storage capacitors in modulators, pulsed lasers, particle accelerators, radars and other applications.

2. Description of Related Art

High voltage switches capable of operation at high peak currents with high rate of current risetime for short pulses are used in modulators for high power RF and microwave amplifiers used in particle accelerators, radar and defense applications. Other applications requiring these switches include medium and high power pulsed lasers, kicker magnet drivers, compact x-ray sources for medical and industrial applications, pulsed electron, ion or radiation sources for material processing and food and water purification.

Typically, thyratrons switch tens of kilovolts at high current and at high rate of current risetime for many of these applications. Ignitrons and spark gaps switches are also employed. All of these devices have one or more of the following disadvantages: high cost, limited lifetime, and expensive maintenance and/or replacement. In addition, warm-up periods are often required, and the devices may exhibit performance changes over time. Finally, the mounting, cooling and triggering of these devices can be complex.

Solid state devices, such as thyristors, can have long lifetimes and minimal maintenance costs, but are typically capable of operation at only a few kilovolts and at maximum current risetimes of a few kiloamps per microsecond. Thyristors can be connected in series for higher voltage operation, but fast rising high current gate pulses for each thyristor are required to insure near-simultaneous turn-on and kA/$\mu$s switch current risetimes. Because each thyristor in the stack is floating at a different potential, the gate current pulses must be isolated. Pulse transformers at each gate, with a single high current trigger generator driving the transformer primaries, can accomplish this isolation. This approach, which includes the requirement for a saturable inductor, discussed in the next paragraph, is similar to the switch described in U.S. Pat. No. 5,331,234. However, pulse transformers capable of tens of kV's isolation with the low leakage inductance necessary to maintain the fast rising high current gate pulse, are large and costly. An alternate approach is to use isolated gate drive circuits for each device, triggered by low current pulses delivered via much smaller pulse transformers. However, the DC power source for each gate drive must be isolated.

The switch described in U.S. Pat. No. 5,331,234 uses energy in the snubber circuit to help turn on devices (but not to trigger them). This energy would not be there in the event of a load fault.

The individually packaged thyristors must be stacked, clamped, cooled, and triggered with appropriate insulation. Also, for high di/dt applications, saturable inductors, (also referred to as magnetic assist or magnetic switches) are typically employed to allow sufficient time for complete turn-on of the thyristor before it can conduct large currents. Generally, it is necessary to design the saturable inductor for each specific application. These criteria make for a switch that is bulky, expensive, and complex to install, mount, trigger and cool. In addition, the user is often responsible for designing, assembling and testing the switch.

The size and trigger system requirements preclude the use of these thyristor stacks as drop-in replacements for thyratrons in existing systems.

Insulated gate bipolar transistors (IGBT) can also be used to create a high voltage, high power switch. IGBT's are generally capable of a shorter turn-on time and a faster risetime than thyristors, and are much easier to turn off. However, IGBTs have higher on-state loses than thyristors. (The conduction physics for an IGBT is inherently more lossy than the conduction physics for thyristors.) Large arrays of IGBT's connected in series and parallel are necessary to achieve the voltage and current requirements. More complex drive circuitry is also required. As a consequence, IGBT switches with the same voltage and power handling capabilities as thyristor switches are larger and more expensive. Many applications do not require the turn off capability of the IGBT.

In order to trigger any thyristor for a high current, high di/dt application, particularly if multiple devices are used in series or parallel, it is necessary to drive the thyristor gate with a large, fast rising current pulse. For all configurations where thyristors are connected in series and many applications in which only a single device is used, there is a large DC potential difference between the gate of the thyristor and the trigger signal, and some form of DC isolation must be provided. A high power trigger transformer capable of high voltage isolation rapidly increases in bulk and cost as the voltage, current and di/dt requirements of the thyristor increase.

SUMMARY OF THE INVENTION

This invention is a high voltage switch capable of high conduction current with a high rate of current risetime (high di/dt). The switch has a long lifetime, and is rugged, reliable, economical, compact and easy to trigger. The small size and freedom from auxiliary systems will enable the switch to be used as a direct replacement for thyratrons and other high power switches in existing and new systems. These solid-state switches will be more reliable and have a much longer lifetime than the switches they replace.

The high voltage switch described in this invention can be used in applications requiring the rapid discharge of pulse forming networks, capacitors or other energy storing elements. Applications include pulsed lasers, modulators used in particle accelerators, radar systems, industrial processing and medical imaging, and pulsed electron, ion or radiation sources for material processing and food and water purification.

The invention uses a low voltage, low current trigger that can be easily isolated by a small inexpensive transformer to trigger a gate drive circuit floating at the same potential as the thyristor gate. The gate drive circuit obtains its energy from the energy that is being switched in the main circuit. The gate drive circuit can also be triggered with an optical signal, eliminating the trigger transformer altogether. This approach makes it easier to connect many thyristors in series to obtain the desired hold off voltage. Each thyristor has its own gate drive circuit that floats at gate potential.

DETAILED DESCRIPTION OF THE INVENTION

Figure 1:
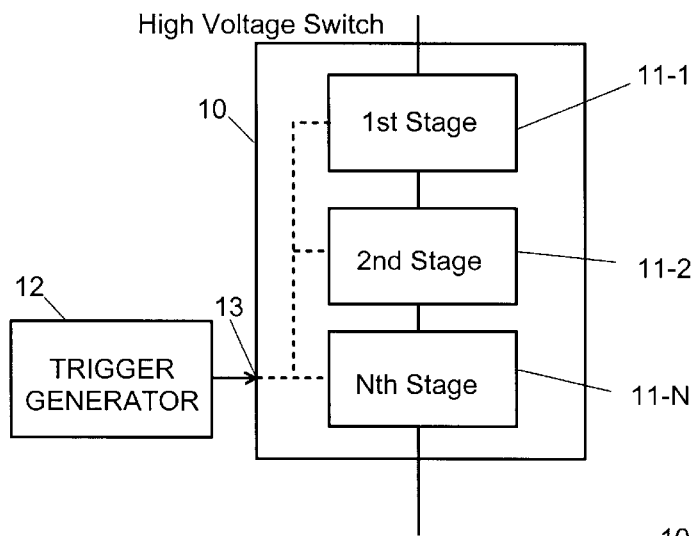
FIG. 1 shows a block diagram of the high voltage switch.

The switch of the invention comprises a series array of thyristors with built-in trigger circuitry, preferably packaged in a single enclosure. The trigger circuit uses a portion of the energy being switched to drive the thyristor gates, eliminating the need for separate isolated gate drive power supplies. A low voltage, low current pulse is required to trigger the module. The trigger transformer is capable of providing >80 KV voltage isolation. Elimination of the need for a gate drive power supply simplifies and lowers the cost of high voltage isolation, and renders scaling to higher voltages a straightforward process. This approach also minimizes the external trigger requirements.

The duration of the gate current pulse is independent of both the volt-second product of the trigger transformer and the length of the main current pulse. This makes it possible to provide a gate pulse duration several times the duration of the main current pulse so that gate drive is still present in the event of a load fault, which results in several cycles of current through the switch.

The multi hundred volt, high current gate pulse from each built-in gate drive circuit ensures rapid, simultaneous turn-on of all devices, resulting in low switch timing jitter (<2 ns). Also the likelihood that a single thyristor will turn-on late and fail due to overvoltaging, is minimized.

The high gate current enables high di/dt operation without the use of saturable inductors (magnetic assist). Thus, the bulk and cost of the inductor and its reset circuit is eliminated, as is the expense of designing this component for each application. Because the saturable inductor delays the turn-on of the switch, variations in its characteristics and reset method after each pulse increase the timing jitter of a switch. Eliminating the inductor avoids this issue.

The individual thyristors used in the switch do not require hermetically sealed packages. All the thyristors and gate drive components are preferably packaged in a single housing that is easy to mount, cool and trigger. This translates to lower overall cost, smaller size, and less complexity than a clamped, cooled, stack of individually packaged thyristors. The switch can be implemented with a single enclosure for all components, or by connecting several enclosures in series, with each enclosure containing several thyristors. This modular approach facilitates the development and manufacture of switches with different maximum voltage ratings.

The thyristors are mounted on a high thermal conductivity, high dielectric strength ceramic substrate. This substrate is used to insulate the thyristor from a metal case, typically attached directly to a heat sink that may be at a different potential than the thyristor. Such a mounting scheme minimizes the thermal resistance between the thyristor and heat sink, and increases the power handling ability of the switch. Also, the total switch inductance can be extremely low if the metal case is used as the return current path.

The switch incorporates thyristors made specifically for pulsed power applications. These thyristors are optimized to minimize turn-on losses and maximize di/dt. The thyristors have a high voltage rating, reducing the number required for a switch. The thyristors are much less costly than comparable (but lower voltage) devices, due to their low-cost packaging and a design that maximizes the yield per wafer. Symmetric (reverse blocking) and asymmetric (reverse conducting) can be used. It will be understood by one skilled in the art that while this paragraph refers to the thyristors currently preferred, other types of thyristors could be used in the switch within the teachings of the invention.

A block diagram of the switch described in this invention is shown in FIG. 1. The switch 10 is comprised one or more switching stages 11-1 to 11-n connected in series. A low current (<1A) pulse from the trigger generator 12 into the trigger input 13 simultaneously triggers all stages.

Figure 2:
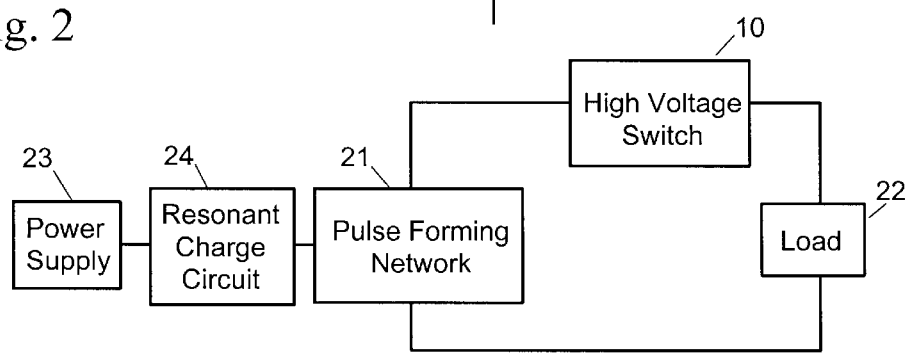
FIG. 2 shows a block diagram of a generic application for the switch.

In a typical system, FIG. 2, the switch 10 is used to discharge a pulse forming network (PFN) 21, or other energy storage element, into the load 22. The switch 10 must be capable of holding off the full voltage of the PFN 21 while open, and conduct the discharge current under normal and fault conditions. For short pulses and/or high peak powers this current, and its rate of rise (di/dt), can be very large. After the PFN 21 has been discharged and the switch 10 has recovered, the PFN is charged by the power supply 23 via the resonant charge circuit 24. Typically the charging time is 10 to 10,000 times longer than the discharge time. Many variations of the circuit are in use, and all impose similar requirements on the switch.

Figure 3:
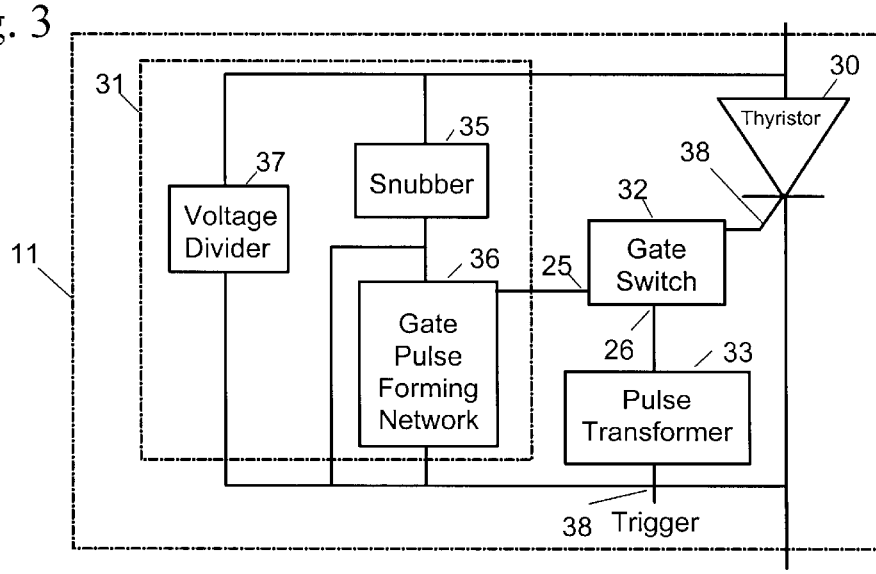
FIG. 3 shows a block diagram of a single stage of the high voltage switch.

Each stage of the switch, FIG. 3 block diagram, has a thyristor 30, energy storage section 31, gate switch 32 and pulse transformer 33. The energy storage section 31, has a snubber section 35 and gate drive pulse forming network (gate PFN) 36.

When the thyristor 30 is in the blocking state (switch is off) energy is stored in the snubber 35 and gate PFN 36 as a result of the voltage across the thyristor. The series combination of the snubber 35 and gate PFN 36 acts as a snubber capacitor, limiting the dv/dt seen by the thyristor to prevent spurious turn on.

The thyristor is turned on when gate switch 32 is closed and current flows from the gate PFN 36 output into the energy input 25 of the gate switch 32 and into the gate 38 of the thyristor. The parameters of this gate PFN 36 are selected to produce a gate pulse of sufficient length to insure gate current is present during the entire turn-on period. The gate switch 32 can be any fast-closing switch including MOSFET's, IGBT's and thyristors, and is triggered 26 by a low voltage, low current signal using a pulse transformer 33 to allow the gate circuit to float at a different DC potential than the trigger signal. The gate switch 32 can also be triggered optically.

Electrical Operation of a Single Stage

Figure 4:
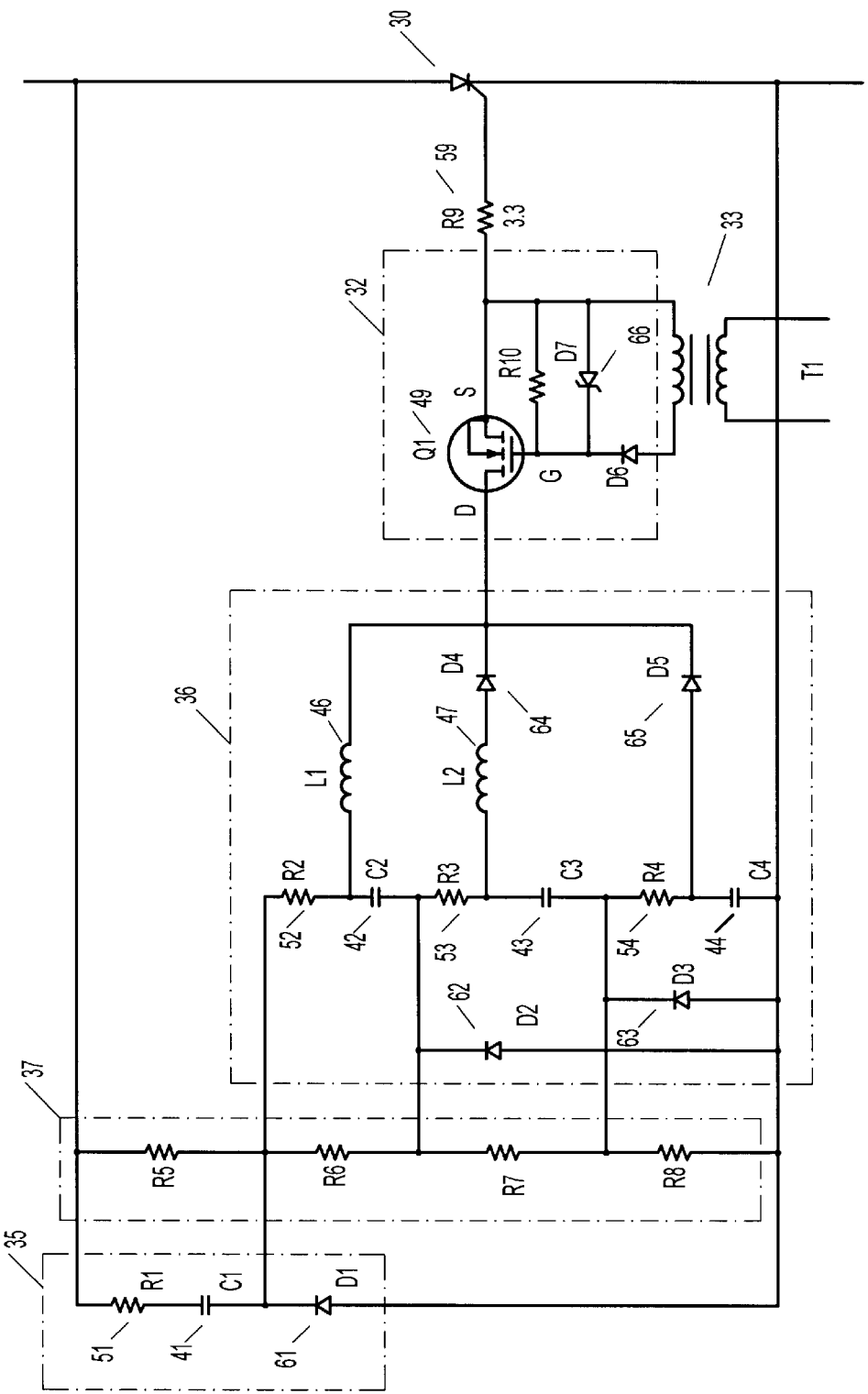
FIG. 4 shows a schematic of a single stage of the switch.

The schematic of a preferred embodiment of one stage of the switch is shown in FIG. 4. When the thyristor 30 is in the blocking state (switch is off), the snubber capacitor 41 and gate PFN capacitors 42, 43, 44 are charged on the same time scale as the external PFN. The value of the resistors 51, 52, 53, 54 are selected so that their RC time constants are small relative to the charging time.

Several considerations determine the selection of capacitor values. The ratio of the snubber capacitance to the gate PFN capacitance determines the percentage of the voltage across the thyristor that appears on the gate PFN. This voltage must be sufficient to ensure positive gate current during the turn-on interval. The gate drive voltage must be greater than the inductive voltage drop from gate to cathode of the thyristor caused by the rapidly rising load current. The snubber capacitance must be sufficient to limit dv/dt imposed on the thyristor and to provide a source of fast rising anode current to aid in turn-on of the thyristor. However, the total snubber and gate PFN capacitance should be no greater than necessary in order to minimize their stored energy, because this energy is dissipated in the gate circuit and thyristor.

The voltage divider 37 has a similar voltage division ratio as the snubber and PFN capacitor combination, and serves to ensure proper voltage distribution between the capacitors for very long charging times. The voltage divider 37 has a high impedance to minimize power dissipation. The voltage divider also aids in equalizing the voltage sharing between series connected stages by partially compensating for differences in leakage currents between thyristors.

The snubber circuit 35 is isolated from the gate PFN by resistor R2 52 and diode D1 61. This isolation is possible because of the different time scales for charging and discharging the energy storage element (PFN) 21 in the external circuit as discussed above. The value of resistor R2 52 is chosen so that its effect on the circuit during the charging cycle is negligible, but its value is sufficiently high to effectively isolate the snubber capacitance from the PFN capacitance during the short discharge interval. When the thyristor turns on, the snubber capacitor 41 discharges through the thyristor 30 and diode D1 61, providing a high di/dt current that speeds up turn-on of the thyristor, with little effect on the voltage on the gate PFN. The values for the components in the gate PFN can be selected so that gate drive is still available after the thyristor has completely turned on and the snubber capacitor 41 is discharged. This capability is advantageous for many applications, providing protection of the thyristor in the event of a load fault. Should a fault occur in the load during the discharge interval, the current through the thyristor may increase substantially and there may be several cycles of current instead of one cycle. The thyristor may be destroyed if there is not sufficient gate drive current, either in the middle of a pulse when the current suddenly increases, or during the forward conduction cycles following the initial triggered cycle. By isolating the gate drive circuit, gate drive can be provided for an interval several cycles long, protecting the switch against this failure.

The capacitors in the gate PFN 36 are connected in series during the charging cycle. The value of isolation resistor R4 54 is chosen such that the RC time constant of this resistor and C4 44, is less than the charging interval but greater than the discharge time. The same is true for R3 53 and C3 43. These isolation resistors have negligible effects on the circuit during the charging cycle but isolate the gate PFN capacitors from each other during the discharge cycle.

Figure 5:
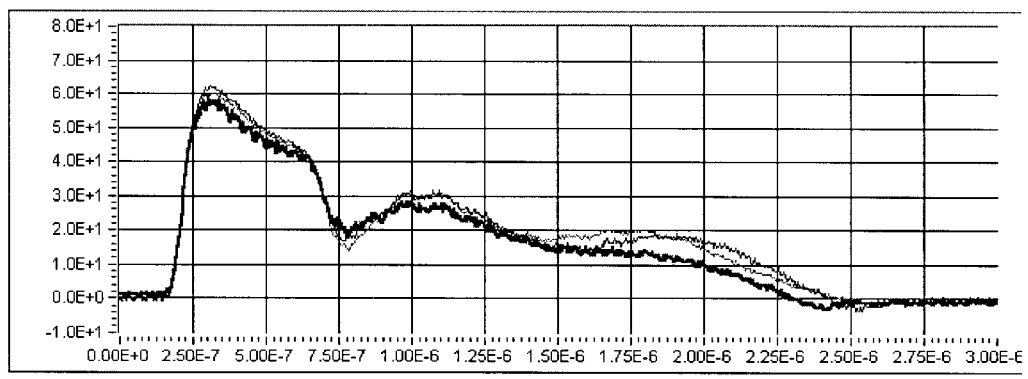
FIG. 5 shows a wave form of the gate current pulse.

When the gate switch is triggered, diodes 62, 63, 64, 65 effectively connect the gate PFN capacitors in parallel as they drive positive current through the thyristor gate 38. The voltage applied to the gate is ⅓ of the total gate PFN voltage, if C2 thru C4 have equal values. The values of the gate PFN capacitors and series inductors are selected using standard pulse forming network design techniques to obtain the desired gate pulse shape. The gate PFN shown in FIG. 4 has 3 sections; more or less sections can be used. FIG. 5 shows waveforms of the gate current pulse for a three stage switch.

Figure 6:
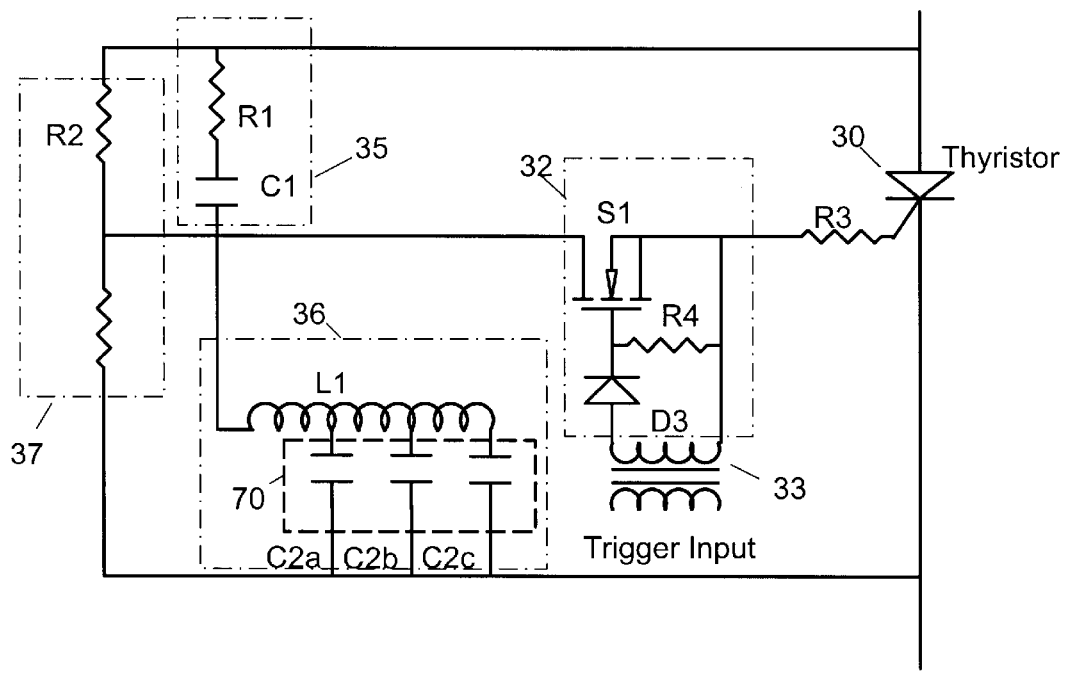
FIG. 6 shows a simplified schematic for an alternate embodiment of a single stage of the switch.

An alternate approach, shown in the simplified schematic in FIG. 6, is to eliminate diodes 62, 63, 64, 65, and to rearrange the gate PFN circuit so the capacitors 70 are charged and discharged in parallel. This decreases the voltage hold-off requirement for the gate switch 32. With this configuration, the ratio of energy stored in the snubber circuit to energy stored in the gate PFN, is greater than for the FIG. 4 configuration, resulting in a less efficient circuit if the additional snubber energy is not needed to improve thyristor turn-on.

The gate switch 32 can be any fast-closing switch including MOSFET's, IGBT's and thyristors. The gate switch 32 is triggered by a low voltage, low current signal using a pulse transformer 33 to allow the gate circuit to float at a different DC potential than the trigger signal. Zener diode D6 66 limits the voltage applied to the gate switch 32, allowing trigger pulses with a wide range of magnitudes to be applied to the primary of the pulse transformer.

The gate switch 32 can also be triggered optically using a light source such as a light emitting diode mounted next to the gate switch 32, or by using fiber optics to conduct light from a remote source, eliminating the need for an isolation transformer. An intense light source is required for minimum turn on delay.

Figure 7:
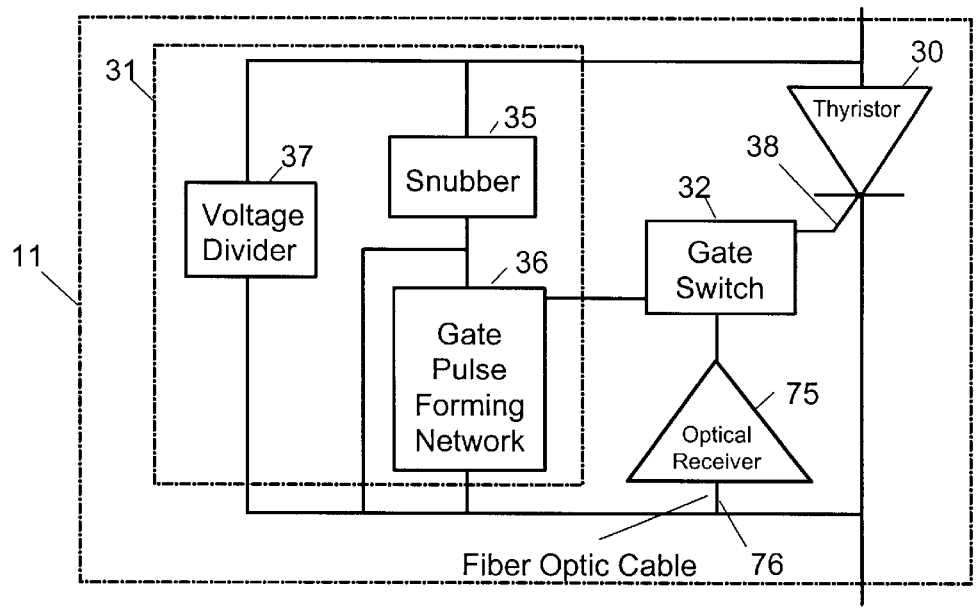
FIG. 7 shows a block diagram of an optically triggered single stage of the switch.

Instead of triggering the gate switch 32 directly, a much less intense light source can be used to trigger an optical receiver 75 which in turn triggers the gate switch 32 (FIG. 7). This is done using standard fiber optics 76 and optical receivers used in communication and computer networks.

High Voltage Switch Triggering

The high voltage switch 10 uses multiple stages connected in series. Each stage 11 can have several thyristors 30 connected in parallel, all driven by the same gate circuit, to increase the current handling capability of the switch, and it will be understood by one skilled in the art that when the term "thyristor" is used it is intended to include single thyristors and also multiple thyristors. The primaries of the pulse transformer 33 for each stage can be connected together, either in series or in parallel. One approach is to use toroidal core pulse transformers with single turn primaries, all connected in series. The primary windings are made by threading a single cable with high voltage insulation through the center of all the toroidal cores. This approach enables voltage isolation at very high (>80 kV) voltages.

Thyristors

The thyristors 30 used in the switch 10 have an interdigitated gate/cathode geometry with extensive serpentine gate patterns and heavy gate connections, to allow for high gate currents in order to be capable of high di/dt operation. The thyristors used in a stage can be reverse blocking, or reverse conducting devices.

The thyristor 30 can also be a dual controlled thyristor (DCT). The DCT is a four-lead asymmetric thyristor (anode, anode gate, cathode, and cathode gate) that turns on and conducts as a 4-layer thyristor, but can be turned off as a reverse biased two-layer diode. Forcing turn-off recovery current to exit the anode and cathode gate regions, increases controllable current and enables rated current to be interrupted to rated voltage without snubbers.

Figure 8:
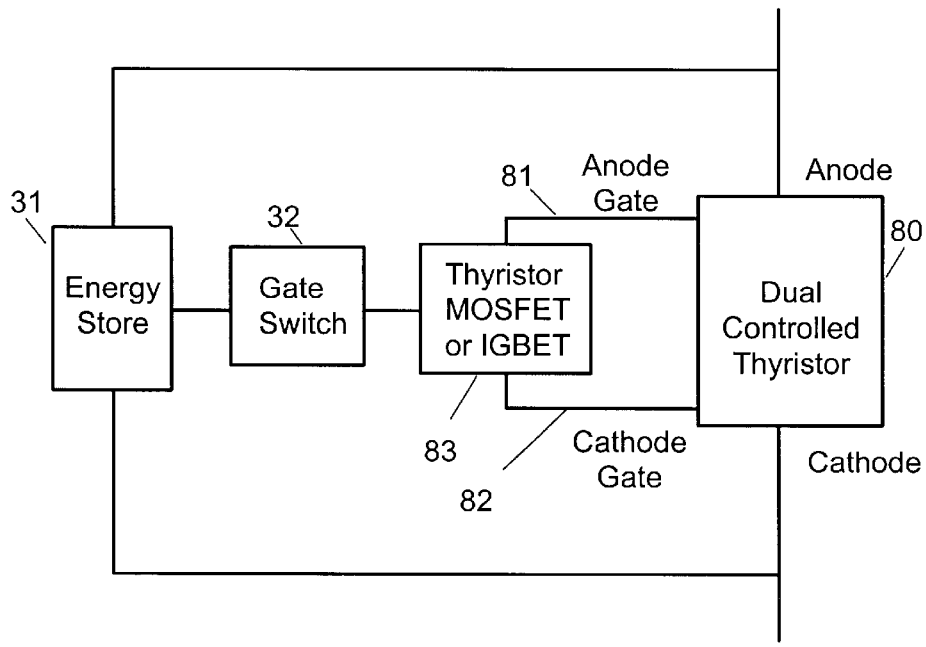
FIG. 8 shows a block diagram of a single stage of the switch used with a dual gated thyristor.

Faster turn-on of the DCT is achieved by connecting both anode and cathode gates together. Turn-on delay time is eliminated by turning on both anode and cathode emitters simultaneously. By modifying the gate drive circuit to switch both gates, nearly instantaneous turn on-time can be achieved. This enables the switch to be used for applications such as crowbar switches, which require short turn-on delays, and kicker switches, which require very low timing jitter. FIG. 8 shows the simplified circuit of the gate drive used to turn on both gates simultaneously. Switch S2, 83 shown as a thyristor in the figure, can be a MOSFET, IGBT, or thyristor. This switch 83 must be capable of holding off the full voltage across the DCT 80.

Device Packaging

The individual thyristors used in the switch do not require hermetically sealed packages. The thyristors and other components from multiple stages are packaged in a single housing that can be hermetically sealed. This translates to lower overall cost, smaller size, and less complexity than a clamped, cooled, stack of individually packaged thyristors. The switch can be implemented with a single enclosure for all stages, or by connecting several enclosures in series, with each enclosure containing multiple stages.

There are many ways to package the switch. The package should maximize the power handling capabilities of the switch, while minimizing thermal fatigue. The thermal design should maximize the heat transfer from the thyristors using appropriate materials and techniques to minimize the mechanical stresses resulting from the power cycling. Typically, energy is deposited in the thyristor during a few microsecond pulse and conducted to heat sink during a few millisecond interval between pulses. The approach described here results in an economical package, one that is easy to mount and cool, and one that has a very low circuit inductance.

Figure 9:
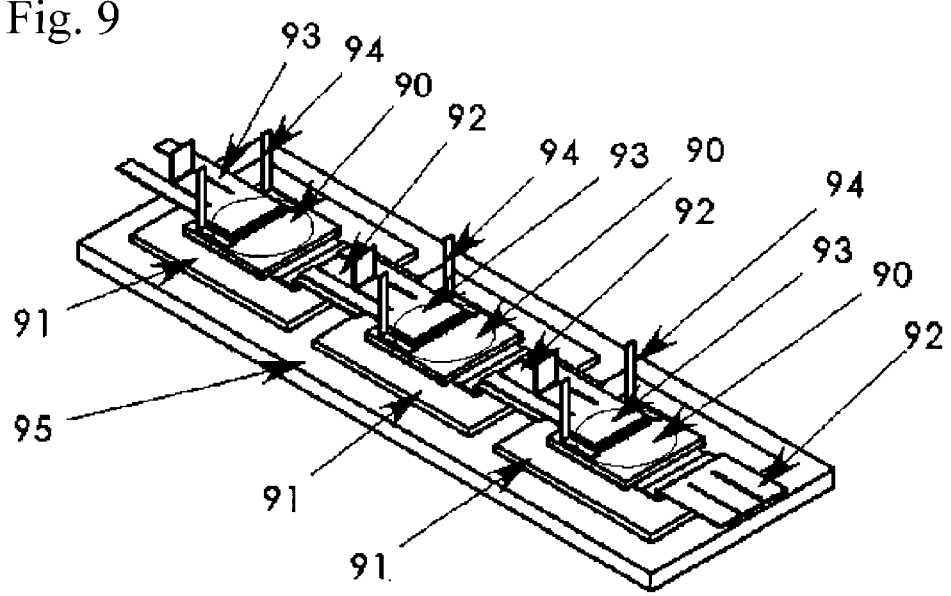
FIG. 9 shows a means of mounting the thyristor on the metal case.

FIG. 9 shows a preferred method of packaging the thyristor. The semiconductor thyristor chip 90 is soldered to one side of a high thermal conductivity, high dielectric strength ceramic substrate 91 with metallized layers on one or both sides. One or more of these assemblies are attached to a metal case 95, which in turn is typically attached directly to a heat sink that may be at a different potential than the thyristor chip 90. Such a mounting scheme minimizes the thermal resistance between the thyristor and heat sink, thus increasing the power handling ability of the switch. One or more thyristor chips connected in series or parallel can be attached to a single ceramic substrate. Heat dissipated in the thyristors is conducted through the substrate to the case. The substrate must have a high thermal conductivity and a high dielectric strength, so that it can be very thin to maximize heat removal from the thyristors, and thus maximize the power handling capability of the switch. Many ceramics such as BeO and AlN, have these attributes. Although AlN has slightly lower thermal conductivity (170 $Wm^{-1}K^{-1}$) than BeO (260 $Wm^{-1}K^{-1}$), it has a lower thermal expansion coefficient that is a better match to a silicon thyristor.

If desired, a further reduction in the thermal resistance is obtained by attaching a similar ceramic and metal case assembly to the top side of the thyristor chip 90.

There are many ways to hold the substrate 91 and case 95 together. A clamp can be used with thermal interface compound applied at the interface between the substrate 91 and the case 95. Alternatively, high thermal conductivity epoxy can be substituted for the interface compound. A third approach is to solder the substrate 91 to the case 95, which results in a lower total thermal resistance than the former approaches. If solders with different melting points are used, the thyristor chip 90 can be soldered to the substrate 91 in a separate operation than the one soldering the substrate 91 to the case 95.

Thyristors connected in parallel can be mounted in close proximity to each other to improve current sharing between devices, and require only a small increase in switch size while increasing the current ratings of the switch by a factor of 2 or more.

The connections between the thyristor chips 90 are made using wide metal lead frames 92, 93 which run close to the surface but are insulated from the case. If the case 95 is used as the return current path, the switch will have a very low inductance. The cathode 93 and gate 94 lead frames can be attached to the thyristor chip 90 using etch-formed leads connected to solder bumps on the gate and cathode side of the thyristor chip 90. This configuration decreases the gate-to-cathode inductance, lowering the voltage requirements of the gate drive. This also makes it possible to cool the device from both sides if desired.

The anode side of the thyristor chip 90 is solder bumped to the metallized ceramic substrate 91. The metallized layer is sufficiently thick to conduct the full switch current, and is patterned so that the metallized region extends beyond the area of the thyristor chip 90 in a manner that allows the anode lead frame 92 to be attached to it.

One implementation of a 12 kV switch 10 uses three stages 11 with one thyristor 30 per stage. The metallized ceramic substrate 91 is 1.2 mm thick high thermal conductivity AlN ceramic. This thickness is sufficient to provide insulation so that any of the thyristor chips 90 can be at a 12 kV potential while the case 95 is grounded.

This packaging approach requires an increasingly thicker ceramic insulating layer, or multiple layers, as the total voltage across the switch increases. At some voltage, it becomes more practical to connect multiple modules in series to obtain the desired hold-off voltage.

Switch Packaging

The thyristors and other components for multiple stages are packaged in a single housing that can be hermetically sealed. The high voltage switch can be implemented with a single enclosure for all stages, or by connecting several enclosures in series, with each enclosure containing multiple stages. This modular approach facilitates the development and manufacture of switches with different maximum voltage ratings.

Figure 10:
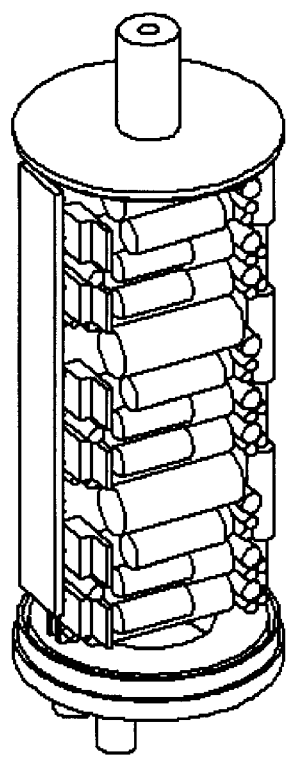
FIG. 10 shows a switch replacement for a 16 kV ceramic thyratron.

FIG. 10 shows a switch intended as a drop-in replacement for a 16 kV ceramic thyratron. This switch has 5 stages 11, each stage rated for >4 kV. The 10 mm diameter thyristors 30 used for the switch have been developed specifically for short pulse, high di/dt applications. These devices have a heavy gate connection and an extensive serpentine gate pattern that minimizes turn-on time. The devices have positive beveling at the edge of the dies that spreads out the electric field lines on both sides of the high voltage junction when the device is forward biased. This enables high voltage devices in small packages. All components are packaged in a single housing.

Figure 11:
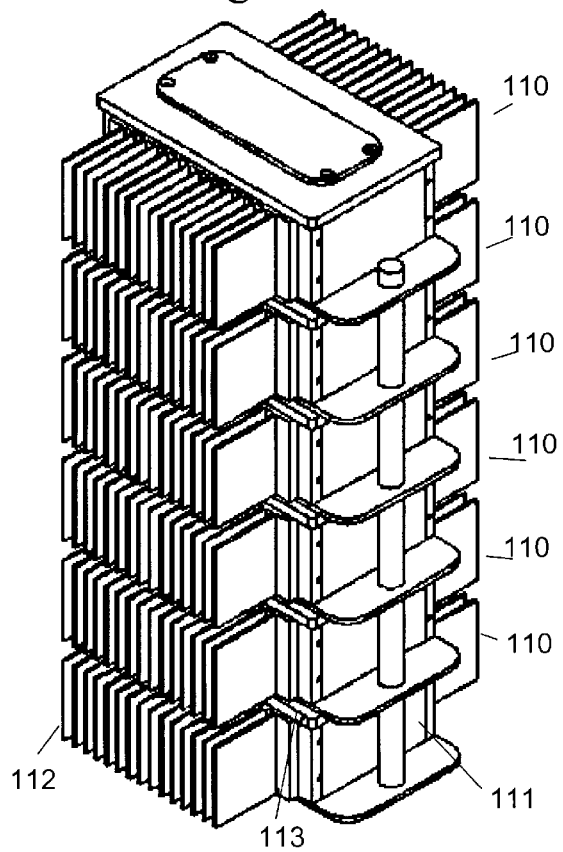
FIG. 11 shows a switch replacement for a 50 kV ceramic thyratron.

FIG. 11 shows a drop-in replacement switch for a 50 kV ceramic thyratron. This switch uses 6 separate modules 110 with metal enclosures 111. Heat sinks 112 are shown attached to each enclosure 111 to cool the switch. Each module has an insulator 113 to permit each enclosure 111 to be at a different potential than those of adjacent modules 110. When the switch is not conducting, the total switch voltage is distributed between the modules 110. Inside the module 110, the maximum potential difference between any component and the enclosure 111 is <10 kV. This allows the thyristor chips 90 to be mounted on the inside of the enclosure 111 with a thin layer of ceramic substrate 91. This mounting scheme minimizes the thermal resistance between the thyristors chips 90 and heat sink 112, thus increasing the power handling ability of the switch. Each enclosure has three 4.5 kV stages 11. Each stage 11 has two 13 mm square thyristors 30 connected in parallel.

High Voltage Switch Performance

Figure 12:
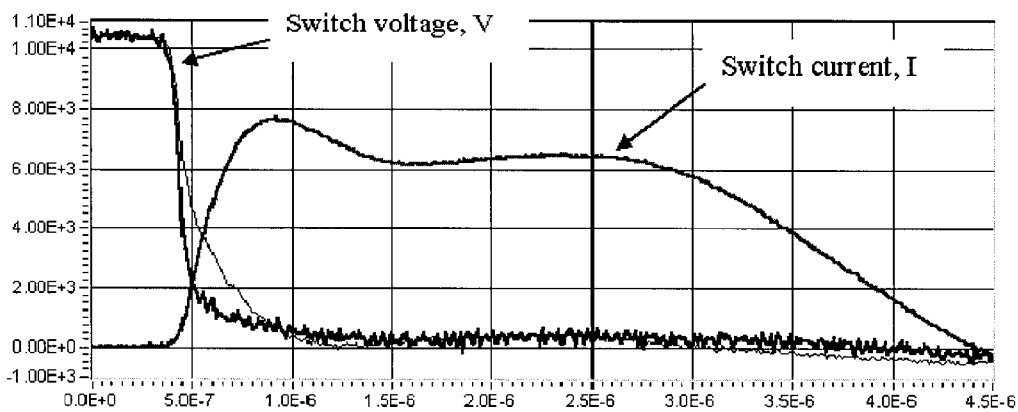
FIG. 12 shows the switch current and voltage and the load voltage for a switch operating at 10 kV.
Figure 13:
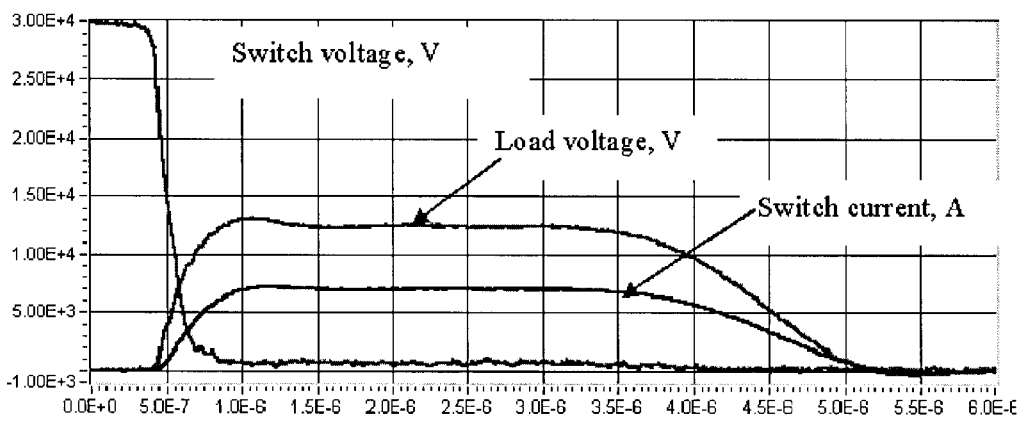
FIG. 13 shows the switch current and voltage and the load voltage for a switch operating at 30 kV.

FIG. 12 shows the switch current and voltage and the load voltage for a 3 stage switch 10 operating at 10 kV. FIG. 13 shows the switch current and voltage and the load voltage for a 9 stage switch 10 operating at 30 kV.

Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

What is claimed is:

1. A high voltage switch comprising:
   a) a first terminal and a second terminal;
   b) a switch trigger input;
   c) a plurality of switching stages between the first terminal and the second terminal, such that each of the switching stages has a conductive path through the stage when the switch is closed and the switching stage is non-conductive when the switch is open, each stage comprising:
   i) a stage trigger input coupled to the switch trigger input;
   ii) a thyristor having an anode, a cathode and a gate, the thyristor forming a conductive path through the stage when the thyristor is turned on and opening the path when the thyristor is in a blocking state;
   ii) a gate switch having a trigger input coupled to the stage trigger input, an energy input, and an output coupled to the gate of the thyristor;
   iii) an energy storage section coupled to the anode of the thyristor and the cathode of the thyristor, the energy storage section including an output coupled to the energy input of the gate switch;
   such that when the thyristor is in a blocking state, energy is stored in the energy storage section, and when the stage trigger input is activated the gate switch closes and energy from the energy storage section energy output is applied to the gate of the thyristor, turning on the thyristor;
   the conductive paths of the switching stages being connected in series and the stage trigger inputs of the plurality of switching stages being coupled in parallel.

2. The switch of claim 1 in which the stage trigger input is electrical, and the gate switch is coupled to the stage trigger input through a pulse transformer.

3. The switch of claim 1 in which the stage trigger input is optical, and the gate switch is coupled to the stage trigger input through an optical receiver.

4. The switch of claim 1 in which the energy storage section of the thyristor switching stages comprises a snubber and a gate pulse forming network, the gate pulse forming network having an output coupled to the output of the energy storage section.

5. The switch of claim 4, in which the energy storage section of the thyristor switching stages further comprises a voltage divider.

6. The switch of claim 4, in which the gate pulse forming network comprises a plurality of capacitors, the capacitors being charged in series and the capacitors discharging in parallel through the output of the energy storage section.

7. The switch of claim 4, in which the gate pulse forming network comprises a plurality of capacitors, the capacitors being charged in parallel and the capacitors discharging in parallel through the output of the energy storage section.

8. The switch of claim 1, in which the thyristor of the thyristor switching stages is a dual control thyristor.

9. The switch of claim 1, in which the thyristor comprises a plurality of thyristors connected in parallel.

* * * * *